(12) United States Patent
Tung et al.

(10) Patent No.: US 12,506,057 B2
(45) Date of Patent: Dec. 23, 2025

(54) INTERPOSER DEVICE AND SEMICONDUCTOR PACKAGE STRUCTURE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Hao-Yu Tung, Hsinchu (TW); Sheng-Fan Yang, Hsinchu (TW); Hung-Yi Chang, Hsinchu (TW); Yi-Tzeng Lin, Hsinchu (TW); Wei-Chiao Wang, Hsinchu (TW); Wei-Hsun Liao, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 388 days.

(21) Appl. No.: 18/187,660

(22) Filed: Mar. 21, 2023

(65) Prior Publication Data
US 2024/0213129 A1 Jun. 27, 2024

(30) Foreign Application Priority Data
Dec. 23, 2022 (TW) .................................. 111149675

(51) Int. Cl.
*H01L 23/498* (2006.01)
*H01L 23/00* (2006.01)
(Continued)

(52) U.S. Cl.
CPC .... *H01L 23/49822* (2013.01); *H01L 23/5383* (2013.01); *H01L 24/16* (2013.01);
(Continued)

(58) Field of Classification Search
CPC ........... H01L 23/49822; H01L 23/5383; H01L 24/16; H01L 25/0655; H01L 2224/16137; H01L 2924/15192
See application file for complete search history.

(56) References Cited

U.S. PATENT DOCUMENTS

2001/0019172 A1\* 9/2001 Pohl ........................ H01L 23/50
257/E23.079
2021/0315092 A1\* 10/2021 Zeng ...................... H05K 1/023
(Continued)

*Primary Examiner* — Benjamin Tzu-Hung Liu
(74) *Attorney, Agent, or Firm* — CKC & Partners Co., LLC

(57) ABSTRACT

An interposer device comprises two bump regions, a channel region, a plurality of signal lines and a plurality of ground lines. The two bump regions are respectively coupled to two semiconductor devices. The channel region is connected between the two bump regions. The plurality of signal lines are embedded in the two bump regions and the channel region, and electrically connected to the two semiconductor devices for transmitting circuit signals. The plurality of ground lines are embedded in the two bump regions and the channel region for shielding the plurality of signal lines. In each bump region, each signal line comprises a trunk portion, a turning portion, and a signal turning point connected between the trunk portion and the turning portion. The trunk portion extends parallel to a first direction, and the turning portion extends parallel to a second direction.

20 Claims, 8 Drawing Sheets

(51) Int. Cl.
*H01L 23/538* (2006.01)
*H01L 25/065* (2023.01)

(52) U.S. Cl.
CPC *H01L 25/0655* (2013.01); *H01L 2224/16137* (2013.01); *H01L 2924/15192* (2013.01)

(56) References Cited

U.S. PATENT DOCUMENTS

2022/0077048 A1* 3/2022 Suk .................... H01L 23/5383
2024/0113006 A1* 4/2024 Marin ................. H01L 23/5381

* cited by examiner

INTERPOSER DEVICE AND SEMICONDUCTOR PACKAGE STRUCTURE

RELATED APPLICATIONS

This application claims priority to Taiwan Application Serial Number 111149675, filed on Dec. 23, 2022, which is herein incorporated by reference in its entirety.

BACKGROUND

Technical Field

The present disclosure relates to an interposer device and a semiconductor package structure. More particularly, the present disclosure relates to an interposer device and a semiconductor package structure, in a layout using lines comprising turning points to connect vias.

Description of Related Art

With the development of semiconductor manufacturing process in recent years, the size of transistors of semiconductor chips is getting smaller. However, when the size of the transistor is small than a certain size, quantum tunneling effect will happen, resulting in increased leakage current. Therefore, Moore's Law proposed in the past is put to the test. In order to overcome the problem that the size of the transistor cannot be further reduced, the industry has turned the research target to the field of packaging, so as to manufacture smaller products through advanced packaging technology.

In the field of advanced packaging technology, 2.5-dimensional (2.5D) interposer packaging, which is between two-dimensional (2D) interposer packaging and three-dimensional (3D) interposer packaging, is widely used. In 2.5D interposer packaging technology, multiple dies are arranged on the substrate through an interposer device, and different dies may receive signals from other dies or transmit signals to other dies through the interposer device, so as to increase the overall signal density of the package and reduce the overall volume.

In interposer devices, in order to keep signal stable, shielding lines (e.g., ground lines) are used to prevent signal lines from interfering with each other. However, in order to connect the die on the top layer of the interposer to the signal lines on different layers, it is often necessary to cut off parts of the ground line or change the paths of the signal lines and the ground lines, to provide space for embedding vias, resulting in irregular arrangement of the signal lines and the ground lines, thus the effect of shielding are weakened and the difficulty and cost of manufacturing are increased. Therefore, how to embed vias in the interposer device under the condition of maintaining the regular arrangement of signal lines and ground lines is one of the subjects in this field.

SUMMARY

In order to overcome the above problems, the present disclosure provides an interposer device for transmitting a plurality of circuit signals between two semiconductor devices. The interposer device comprises two bump regions, a channel region, a plurality of signal lines and a plurality of ground lines. The two bump regions are respectively coupled to the two semiconductor devices. The channel region is connected between the two bump regions. The plurality of signal lines are embedded in the two bump regions and the channel region, and are electrically connected to the two semiconductor devices for transmitting the plurality of circuit signals. The plurality of ground lines are embedded in the two bump regions and the channel region for shielding the plurality of signal lines. In each bump region, each signal line comprises a signal turning point, a trunk portion and a turning portion. The signal turning point is connected between the trunk portion and the turning portion, the trunk portion extends parallel to a first direction, and the turning portion extends parallel to a second direction, so that when the interposer device is viewed parallel to a third direction, each signal line in each bump region is L-shaped, wherein the third direction is substantially perpendicular to the first direction and the second direction.

The present disclosure provides a semiconductor package structure. The semiconductor package structure comprises two semiconductor devices and an interposer device. The interposer device is coupled between the two semiconductor devices and configured to transmit a plurality of circuit signals between the two semiconductor devices. The interposer device comprises two bump regions, a channel region, a plurality of signal lines and a plurality of ground lines. The two bump regions are respectively coupled to the two semiconductor devices. The channel region is connected between the two bump regions. The plurality of signal lines are embedded in the two bump regions and the channel region, and are electrically connected to the two semiconductor devices for transmitting the plurality of circuit signals. The plurality of ground lines are embedded in the two bump regions and the channel region for shielding the plurality of signal lines. In each bump region, each signal line comprises a signal turning point, a trunk portion and a turning portion. The signal turning point is connected between the trunk portion and the turning portion, the trunk portion extends parallel to a first direction, and the turning portion extends parallel to a second direction, so that when the interposer device is viewed parallel to a third direction, each signal line in each bump region is L-shaped, wherein the third direction is substantially perpendicular to the first direction and the second direction.

The interposer device and the semiconductor package structure of the present disclosure are able to make arrangement of the signal lines and the ground lines regular while keeping high signal density, thereby improving the stability and quality of signal lines when transmitting and receiving circuit signals.

BRIEF DESCRIPTION OF THE DRAWINGS

The present disclosure can be more fully understood by reading the following detailed description of the embodiment, with reference made to the accompanying drawings as follows.

DETAILED DESCRIPTION

The term "coupled" or "connected" used throughout the present disclosure may refer to two or more elements physically or electrically contact with each other in direct, or physically or electrically contact with each other in indirect, or two or more elements interact or act on each other.

Although terms such as "first", "second", etc. are used in the present disclosure to describe different elements, these terms are only used to distinguish elements or operations described by the same technical terms. Unless clearly indicated, the terms do not specifically refer to or imply a sequence or an order, nor are they intended to limit the present disclosure.

Reference will now be made in detail to the present embodiments of the disclosure, examples of which are illustrated in the accompanying drawings.

Figure 1:
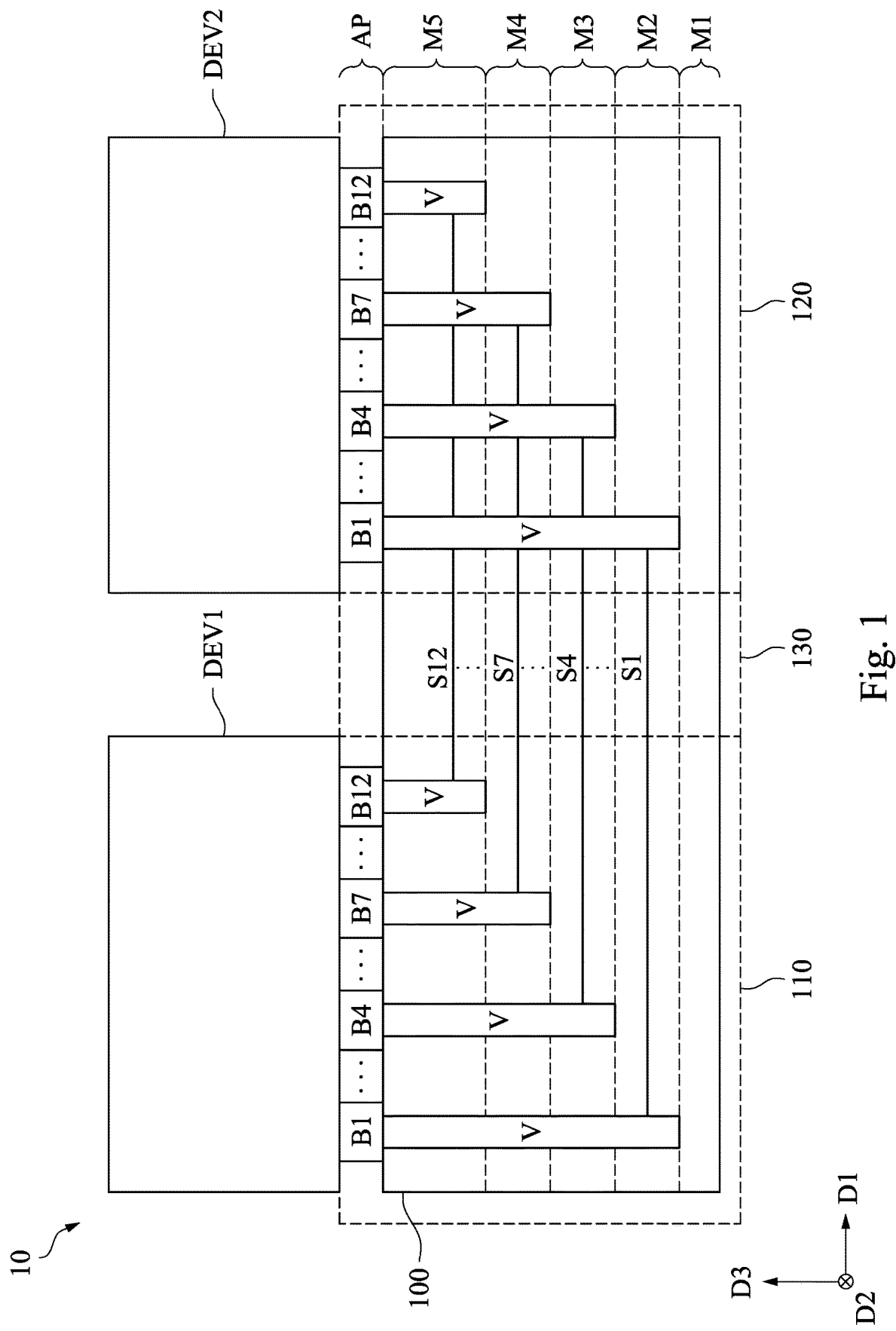
FIG. 1 is a sectional view of a semiconductor package structure in accordance with some embodiments of the present disclosure.

FIG. 1 is a sectional view of a semiconductor package structure 10 along a direction D1 in accordance with some embodiments of the present disclosure. In some embodiments, the semiconductor package structure 10 comprises semiconductor devices DEV1, DEV2 and an interposer device 100. In some embodiments, each of the semiconductor devices DEV1 and DEV2 may be implemented with a system on a chip (SoC), a high bandwidth memory (HBM), a dynamic random access memory (DRAM), other components with similar functions or any combination thereof.

The interposer device 100 is coupled to the semiconductor devices DEV1 and DEV2, and configured to transmit circuit signals between the semiconductor devices DEV1 and DEV2. In some embodiments, the interposer device 100 comprises bump regions 110, 120, a channel region 130, signal lines S1-S12, ground lines G (shown in FIG. 2) and a ground mesh GM (shown in FIG. 2). The channel region 130 is arranged between the bump regions 110 and 120. The signal lines S1-S12, the ground mesh GM and the ground lines G are embedded in the bump regions 110, 120 and the channel region 130.

In some embodiments, each of the bump regions 110 and 120 comprises a bump layer AP, metal layers M1-M5 and a plurality of vias V, wherein the bump layer AP comprises micro bumps B1-B12. The semiconductor devices DEV1 and DEV2 are respectively connected to the bump regions 110 and 120 of the interposer device 100 through the micro bumps B1-B12.

In some embodiments, the metal layers M1-M5 and the bump layer AP are arranged sequentially from bottom to top in a vertical direction D3, and the vias V pass through at least one of the metal layers M2-M5 from the bump layer AP. Therefore, the micro bumps B1-B12 in the bump region 110 may be electrically connected to the micro bumps B1-B12 in the bump region 120 through the channel region 130, with the vias V and the signal lines S1-S12 respectively.

It should be noted that the numbers of semiconductor devices, metal layers, signal lines, ground lines, vias and micro bumps in the present disclosure are only examples, not limiting the present disclosure. The other numbers of semiconductor devices, metal layers, signal lines, ground lines, vias and micro bumps are within the scope of the present disclosure.

Since the wiring in the metal layers M2-M5 of the bump regions 110 and 120 may be arranged through similar process, for the sake of brevity, only the metal layer M2 of the bump region 110 will be described below.

Figure 2:
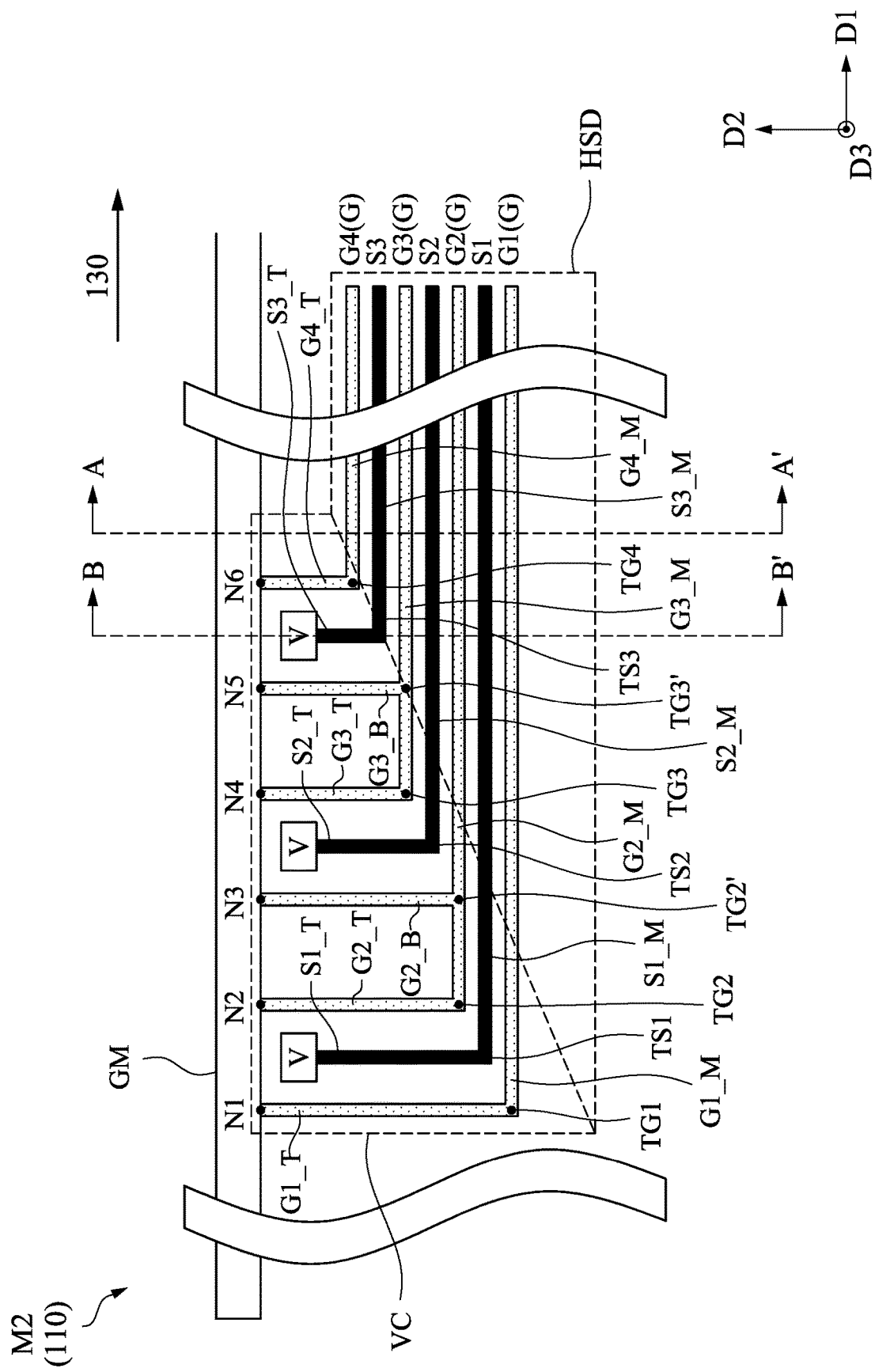
FIG. 2 is a top view of a metal layer of a bump region in accordance with some embodiments of the present disclosure.

FIG. 2 is a top view of the metal layer M2 of the bump region 110 in accordance with some embodiments of the present disclosure. In some embodiments, the vias V are arranged parallel to the direction D1 in the metal layer M2, wherein the direction D1 is parallel to the plane of the metal layers M2-M5. In some embodiments, all of the vias V do not overlap each other.

In the embodiment shown in FIG. 2, the ground lines G comprise ground lines G1-G4. The signal lines S1-S3 and the ground lines G1-G4 are arranged in the metal layer M2, wherein the signal lines S1-S3 and the ground lines G1-G4 are arranged alternately. In some embodiments, in the bump region 110, the signal line S1 comprises a trunk portion S1_M, a turning portion S1_T and a turning point TS1; the signal line S2 comprises a trunk portion S2_M, a turning portion S2_T and a turning point TS2; the signal line S3 comprises a trunk portion S3_M, a turning portion S3_T and a turning point TS3. The turning portions S1_T, S2_T and S3_T extend parallel to the direction D2 and are respectively connected between a corresponding via V and the turning points TS1, TS2 and TS3. The trunk portions S1_M, S2_M and S3_M respectively extend from the turning points TS1, TS2 and TS3, parallel to the direction D1, toward the channel region 130. The directions D1 and D2 are substantially perpendicular to the vertical direction D3. In other words, when viewing the interposer device 100 parallel to the vertical direction D3, the signal lines S1-S12 are L-shaped in the bump region 110. In some embodiments, the structure of the bump region 120 is similar to the structure of the bump region 110, and is symmetrical to the structure of the bump region 110 in the direction D1.

Since the signal lines S1-S3 change their extension direction after passing through the turning points TS1-TS3, in order to keep the alternate arrangement relationship between the ground lines and the signal lines, the ground lines G1-G4 also have turning structures, please refer to the following description.

As shown in FIG. 2, the ground line G1 comprises a trunk portion G1_M, a turning portion G1_T and a turning point TG1. The turning portion G1_T is parallel to the direction D2 and connected between the ground mesh GM and the turning point TG1. The trunk portion G1_M extends from the turning point TG1, parallel to the direction D1, toward the channel region 130. The ground line G4 comprises a trunk portion G4_M, a turning portion G4_T and a turning point TG4. The turning portion G4_T is parallel to the direction D2 and connected between the ground mesh GM and the turning point TG4. The trunk portion G4_M extends from the turning point TG4, parallel to the direction D1, toward the channel region 130.

The ground line G2 comprises a trunk portion G2_M, a turning portion G2_T, a branch portion G2_B and turning points TG2, TG2'. The turning portion G2_T is parallel to the direction D2 and connected between the ground mesh GM and the turning point TG2. The branch portion G2_B is parallel to the direction D2 and connected between the ground mesh GM and the turning point TG2'. The trunk portion G2_M extends from the turning point TG2, parallel to the direction D1, toward the channel region 130. The ground line G3 comprises a trunk portion G3_M, a turning portion G3_T, a branch portion G3_B and turning points TG3, TG3'. The turning portion G3_T is parallel to the direction D2 and connected between the ground mesh GM and the turning point TG3. The branch portion G3_B is parallel to the direction D2 and connected between the ground mesh GM and the turning point TG3'. The trunk portion G3_M extends from the turning point TG3, parallel to the direction D1, toward the channel region 130.

It can be seen from the above that since the ground line G1 is only adjacent to the signal line S1, and the ground line G4 is only adjacent to the signal line S3 (i.e., the ground lines G1 and G4 are only adjacent to one signal line), each of the ground lines G1 and G4 has one turning point in the bump region 110. In other words, when viewing the interposer device 100 parallel to the vertical direction D3, the ground lines G1 and G4 are L-shaped in the bump region 110. Since the ground line G2 is adjacent to the signal lines S1 and S2, and the ground line G3 is adjacent to the signal lines S2 and S3 (i.e., the ground lines G2 and G3 are adjacent to two signal lines), each of the ground lines G2 and G3 has two turning points in the bump region 110. In other words, when viewing the interposer device 100 parallel to the vertical direction D3, the ground lines G2 and G3 are F-shaped in the bump region 110. In addition, in the bump region 120, each of the ground lines G1 and G4 has one turning point, and each of the ground lines G2 and G3 has two turning points.

In some embodiments, the distances between two contacts, where the two adjacent ground lines G of each signal line S1-S12 are coupled to the ground mesh GM, are equal to each other. Taking the embodiment in FIG. 2 as an example, the contacts of the ground lines G1-G4 on the ground mesh GM are the contacts N1-N6. Since the signal line S1 is adjacent to the ground lines G1 and G2, the signal line S2 is adjacent to the ground lines G2 and G3, and signal line S3 is adjacent to the ground lines G3 and G4, the distance between the contacts N1 and N2 is equal to the distance between the contacts N3 and N4, and also equal to the distance between the contacts N5 and N6.

In following paragraphs, the region of the metal layers M2-M5 where the turning portions and the branch portions of the signal lines and the ground lines are embedded, is called a vertical connection region, and the region of the metal layers M2-M5 where the trunk portions of the signal lines and the ground lines are embedded, is called a high signal density region.

Taking the embodiment in FIG. 2 as an example, the vertical connection region VC comprises turning portions S1_T-S3_T, G1_T-G4_T and branch portions G2_B, G3_B. In the vertical connection region VC, the lengths of the turning portions S1_T-S3_T of the signal lines S1-S3 are a decreasing sequence, the lengths of the turning portions G1_T-G4_T of the ground lines G1-G4 are a decreasing sequence, and the lengths of the branch portions G2_B, G3_B of the ground lines G2, G3 are also a decreasing sequence. Therefore, the turning portions S1_T-S3_T, G1_T-G4_T and the branch portions G2_B, G3_B are arranged to form a trapezoidal vertical connection region VC.

Similarly, in the high signal density region HSD, since the lengths of the trunk portions S1_M-S3_M, G1_M-G4_M of the signal lines S1-S3 and the ground lines G1-G4 are also a decreasing sequence, the trunk portions S1_M-S3_M, G1_M-G4_M are arranged to form a trapezoidal high signal density region HSD.

Figure 3:
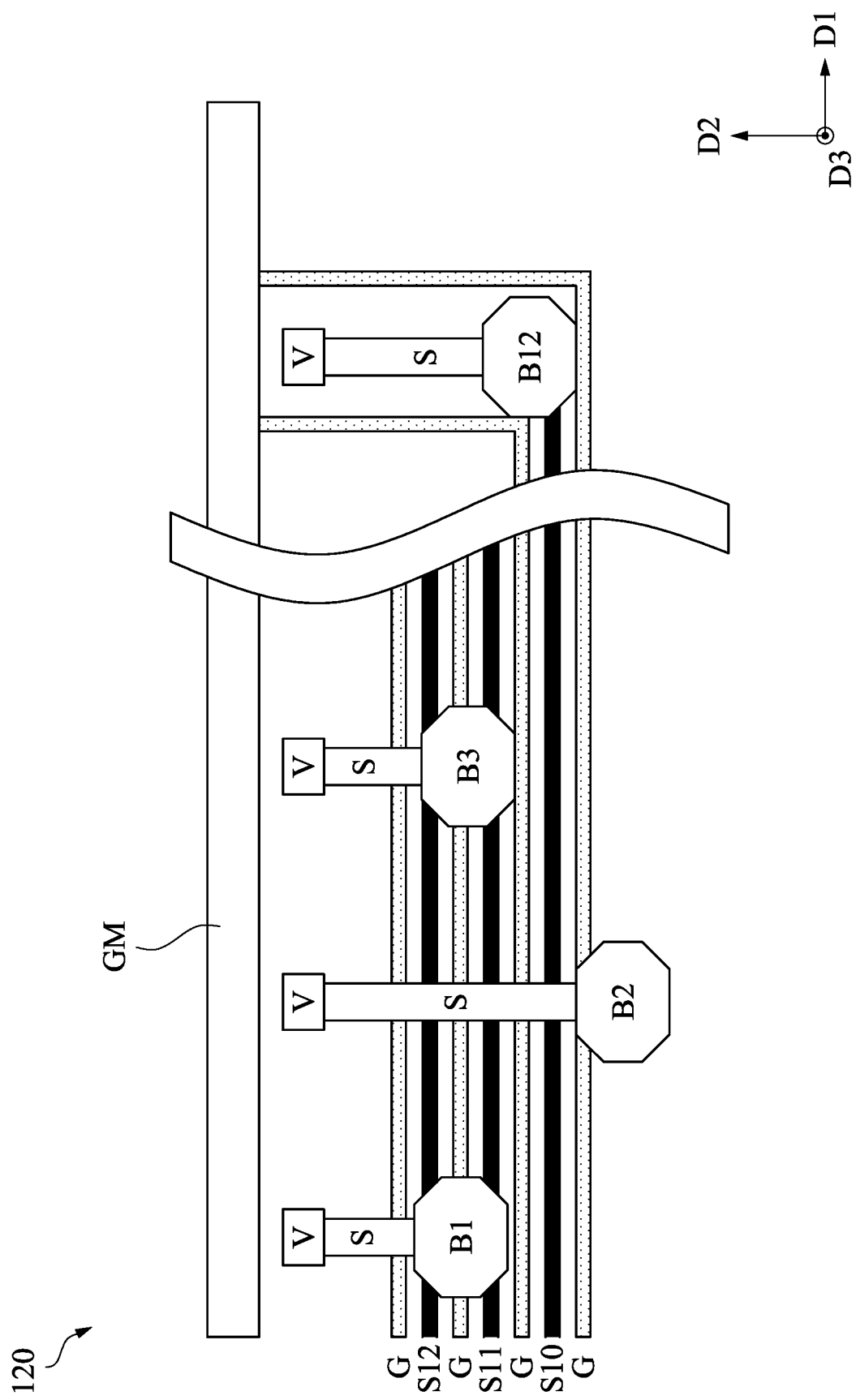
FIG. 3 is a top view of a metal layer and a bump layer in accordance with some embodiments of the present disclosure.

FIG. 3 is a top view of the metal layer M5 and the bump layer AP of the bump region 120 in accordance with some embodiments of the present disclosure. For the sake of clarity, the insulating material between the bump layer AP and the metal layer M5 is omitted in FIG. 3.

As shown in FIG. 3, the bump layer AP comprises micro bumps B1-B12 and a plurality of wires S. The micro bumps B1-B12 are used to respectively connect to the signal lines S1-S12 through the vias V and the wires S.

Please refer to FIG. 2 and FIG. 3 together. In the bump regions 110 and 120, the signal line S1 in the metal layer M2 is connected to a via V, and connected to the micro bump B1 through the via V extending in the vertical direction D3 and a wire S of the bump layer AP. The manner in which the signal lines S2-S12 are respectively connected to the micro bumps B2-B12 is similar to the manner in which the signal line S1 is connected to the micro bump B1, and for the sake of brevity, detailed descriptions are omitted.

As shown in FIG. 3, since the signal lines S1-S12 in the metal layers M2-M5 are turned and extended toward the vias V and are respectively connected to the micro bumps B1-B12 through the vias V, the signal lines S1-S12 and ground lines G of the high signal density region HSD in the metal layers M2-M5 may form a regular arrangement without bending or cutting off the signal lines S10-S12 and ground lines G, thus the effect of shielding are maintained and the difficulty and cost of manufacturing are decreased.

Figure 4:
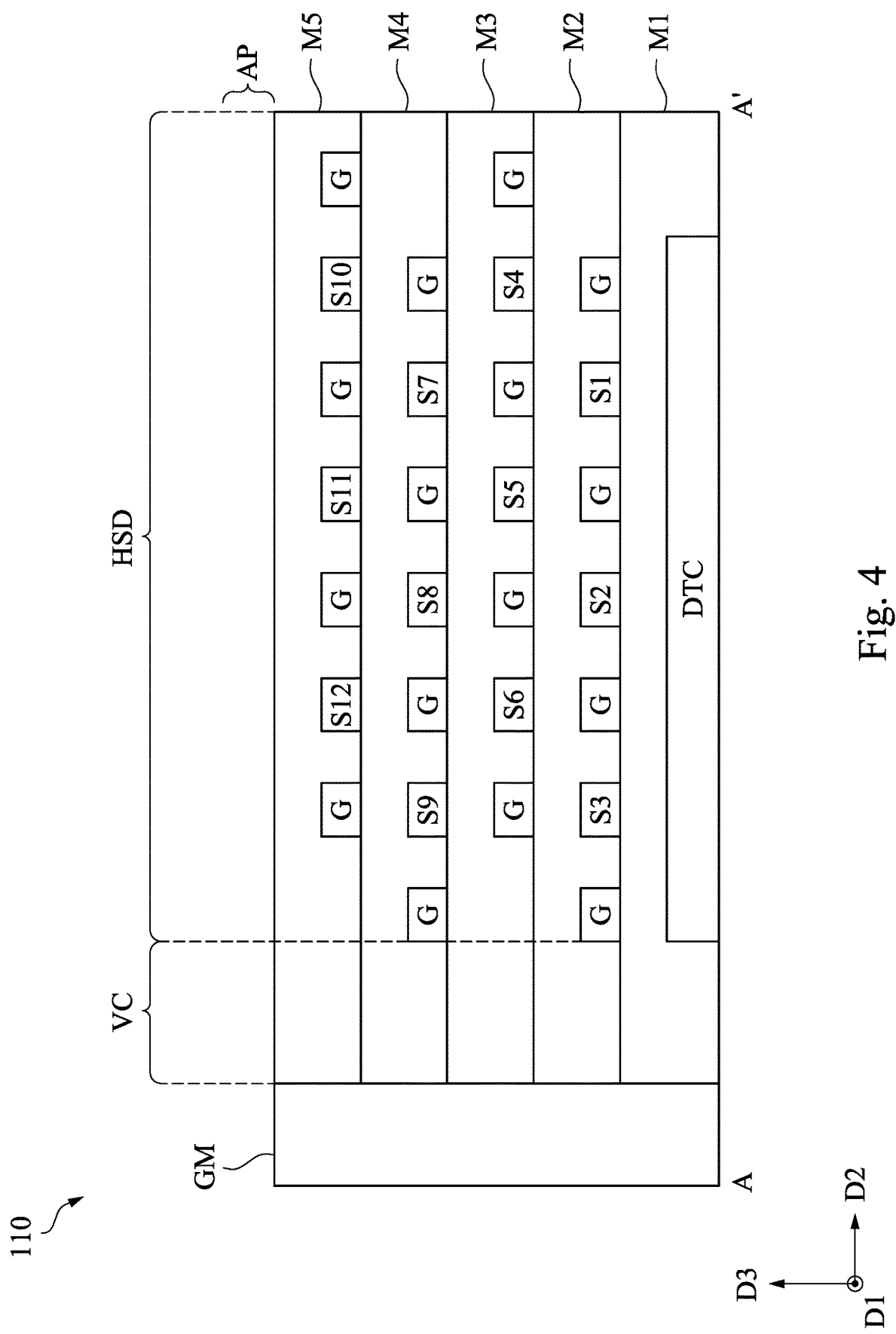
FIG. 4 is a sectional view along a section line A-A' of FIG. 2.

In order to further describe the structure of the bump region 110, please further refer to FIG. 4. FIG. 4 is a sectional view along a section line A-A' of FIG. 2. In some embodiments, the metal layer M1 comprises a deep trench capacitor (DTC), and is located at the bottom of the metal layers M1-M5 in the vertical direction D3.

In some embodiments, the signal lines S1-S12 and the ground lines G are embedded in the metal layers M2-M5. Taking the embodiments in FIG. 2 and FIG. 4 as an example, the signal lines S1-S3 and four ground lines G are embedded in the metal layer M2, the signal lines S4-S6 and other four ground lines G are embedded in the metal layer M3, the signal lines S7-S9 and yet other four ground lines G are embedded in the metal layer M4, and the signal lines S10-S12 and the other four ground lines G are embedded in the metal layer M5. The signal lines S1-S12 are used to transmit circuit signals, and the ground lines G are connected to the ground mesh GM for shielding the signal lines with ground voltage provided by the ground mesh GM.

In some embodiments, before the signal lines S1-S12 reach their corresponding turning points, the ground lines G and the signal lines S1-S12 are parallel to each other in the direction D1, and alternately arranged in the direction D2, so that each of the signal lines S1-S12 is adjacent to two ground lines G. In addition, in the vertical direction D3, each of the signal lines S1-S12 is adjacent to at least one ground line G.

In some embodiments, the signal lines of adjacent metal layers do not overlap with each other. For example, as shown in FIG. 4, the orthographic projections to the metal layer M3 of the signal lines S1-S3 in the metal layer M2 do not overlap with the signal lines S4-S6 in the metal layer M3.

In some embodiments, the signal lines of any of the metal layers M1-M5 overlap the ground lines G of the adjacent metal layer. For example, please refer to FIG. 4 again, the orthographic projections to the metal layer M3 of the signal lines S1-S3 in the metal layer M2 overlap the ground lines G in the metal layer M3.

In conclusion, it can be seen from FIG. 4 that in the section view of the bump region 110, the signal lines S1-S12 and the ground lines G are arranged in a checkerboard pattern, so the ground lines G are able to effectively prevent the signal lines S1-S12 from interfering with each other.

Figure 5:
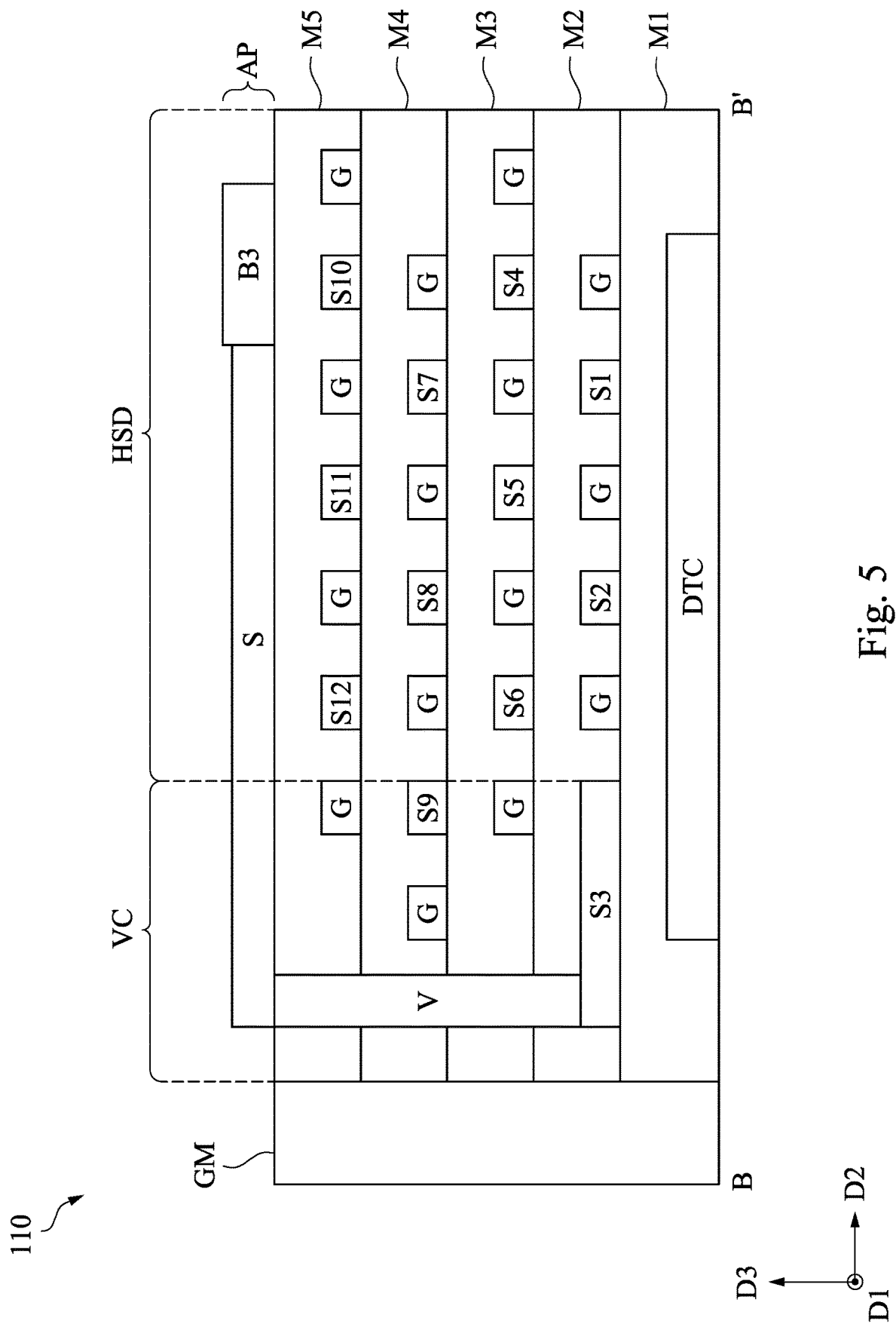
FIG. 5 is a sectional view along a section line B-B' of FIG. 2.

FIG. 5 is a sectional view along a section line B-B' of FIG. 2. As shown in FIG. 5, the bump region 110 comprises the metal layers M1-M5, the bump layer AP, the ground mesh GM and the vias V. After the signal lines S1-S12 reach the vias V, the signal lines S1-S12 may be further connected to the bump layer AP through the vias V. Taking the embodiment in FIG. 5 as an example, the signal line S3 is connected to the bump layer AP through the via V passing through the metal layers M2-M5.

Figure 6:
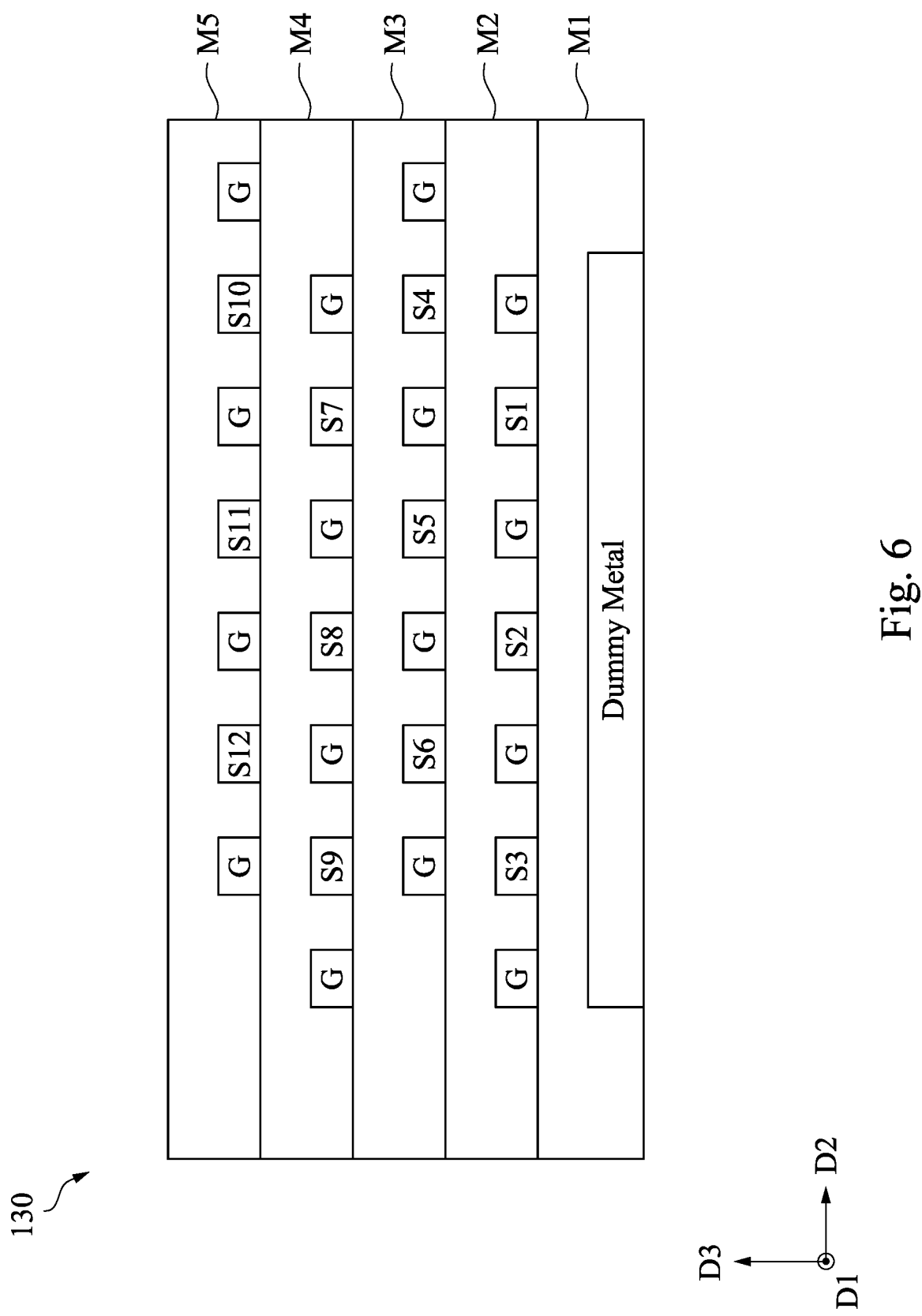
FIG. 6 is a sectional view of a channel region in accordance with some embodiments of the present disclosure.

FIG. 6 is a sectional view of the channel region 130 in the direction D2 in accordance with some embodiments of the present disclosure. Similar to the bump regions 110 and 120, the channel region 130 comprises metal layers M1-M5 sequentially arranged from bottom to top in the vertical direction D3. In some embodiments, the metal layer M1 of the channel region 130 comprises a dummy metal, and the metal layer M1 of the bump regions 110, 120 may not comprise a dummy metal. In some embodiments, the metal layer M1 of the channel region 130 may not comprise a deep trench capacitor.

Since the channel region 130 is used to connect the bump regions 110, 120 and also comprises the metal layers M1-M5, the signal lines S1-S12 and the ground lines G may pass through the metal layers M2-M5 of the channel region 130. As shown in FIG. 6, the signal lines S1-S3 and four ground lines G pass through the metal layer M2 of the channel region 130, the signal lines S4-S6 and other four ground lines G pass through the metal layer M3 of the channel region 130, the signal lines S7-S9 and yet other four ground lines G pass through the metal layer M4 of the channel region 130, and the signal lines S10-S12 and the other four ground lines G pass through the metal layer M5 of the channel region 130.

Therefore, with the above arrangement, the signal lines S1-S12 and the ground lines G in the metal layers M2-M4 of the bump region 110 can extend, through the metal layers M2-M4 of the channel region 130, to the metal layers M2-M4 of the bump region 120, thereby transmitting circuit signals between the semiconductor devices DEV1 and DEV2.

In the foregoing embodiments, the interposer device 100 has a signal transmission structure comprising the bump regions 110, 120, the channel region 130, the signal lines S1-S12, the ground lines G and the ground mesh GM. However, in some embodiments, the interposer device may comprise a plurality of signal transmission structures. Please refer to the description in the following paragraphs.

Figure 7:
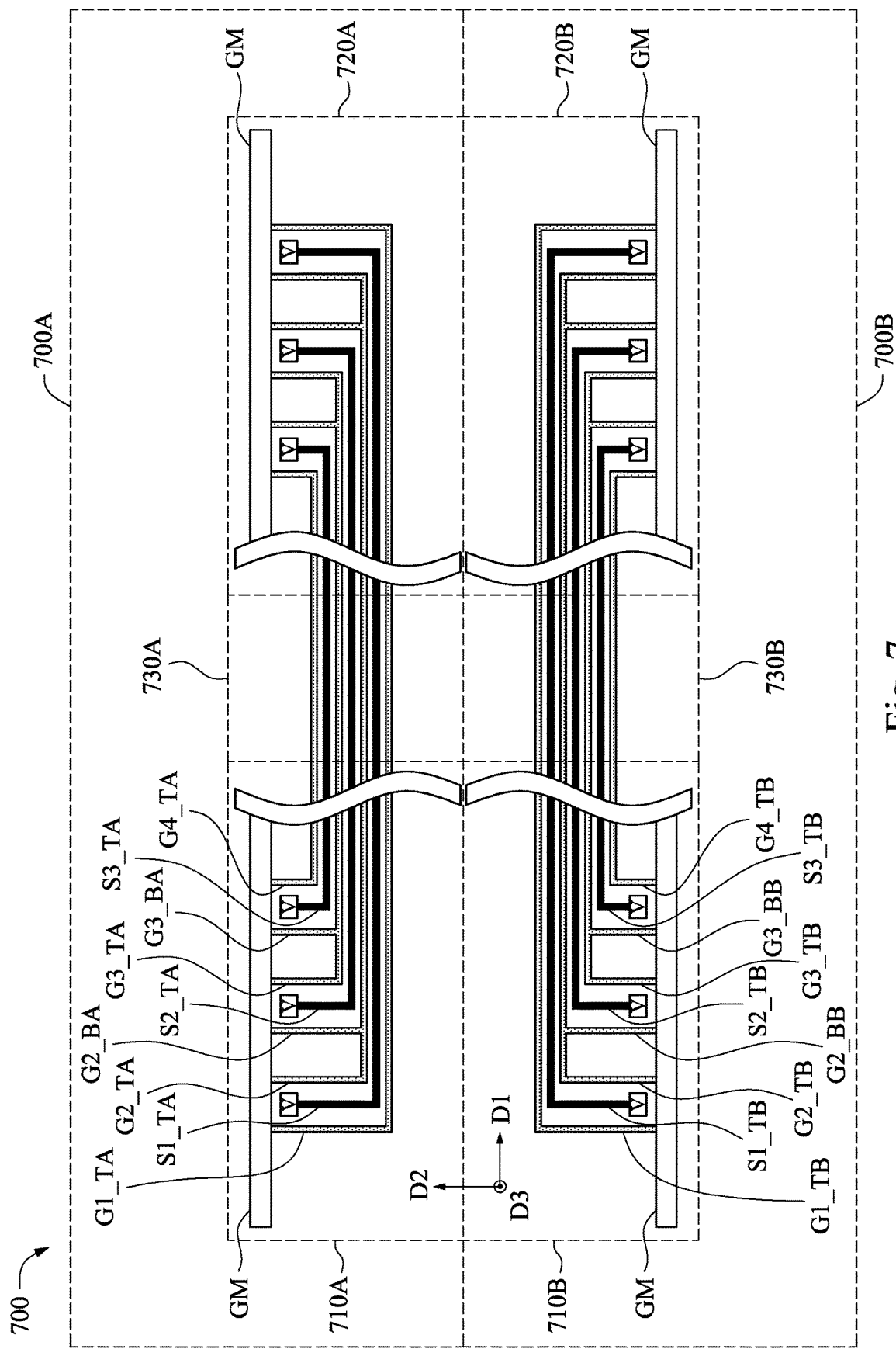
FIG. 7 is a top view of a metal layer of an interposer device in accordance with some embodiments of the present disclosure.
Figure 8:
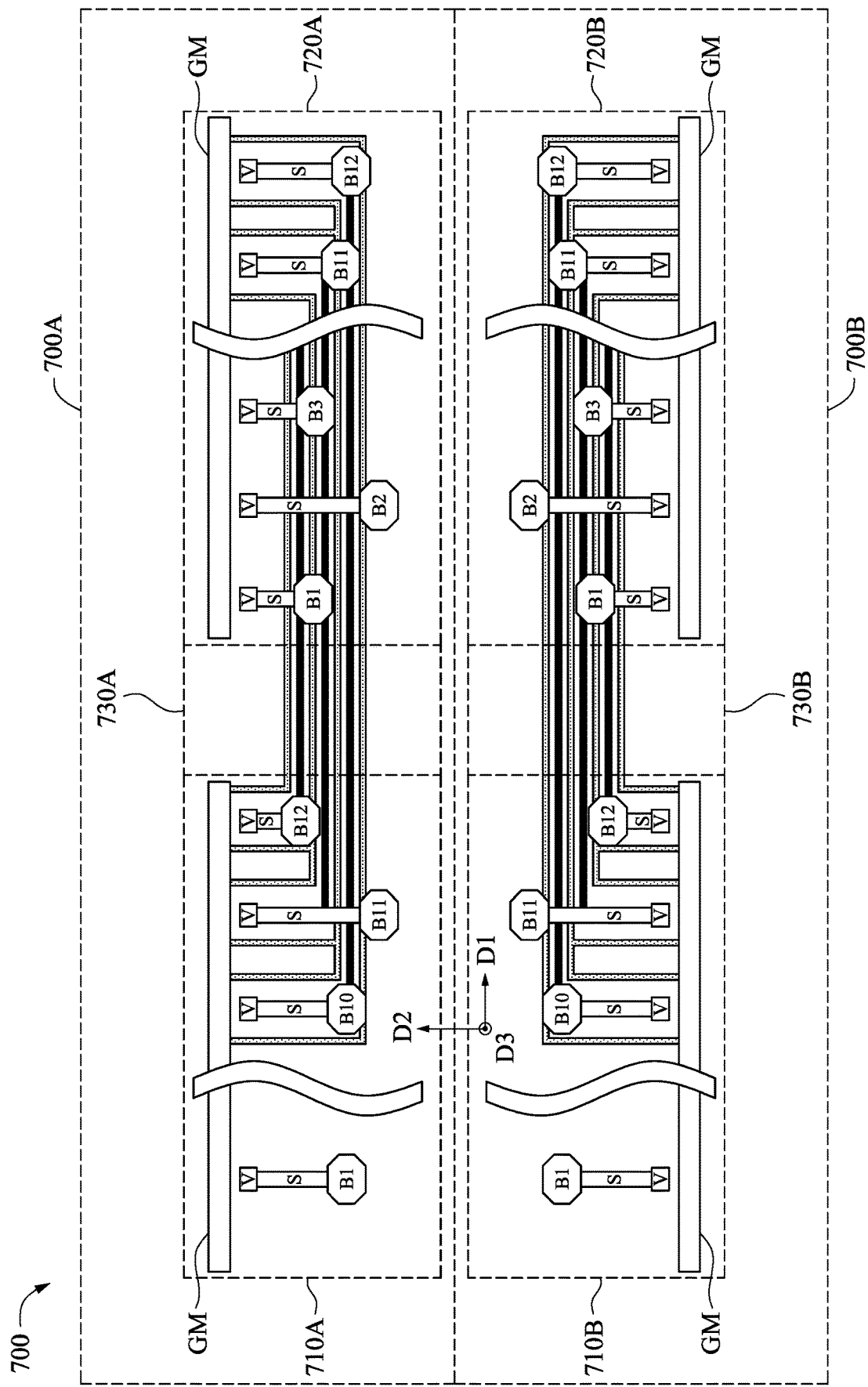
FIG. 8 is a top view of a metal layer and a bump layer of an interposer device in accordance with some embodiments of the present disclosure.

FIG. 7 is a top view of a metal layer M2 of an interposer device 700 in accordance with some embodiments of the present disclosure. FIG. 8 is a top view of a metal layer M5 and a bump layer AP of the interposer device 700 in accordance with some embodiments of the present disclosure. For the sake of clarity, the insulating material between the bump layer AP and the metal layer M5 is omitted in FIG. 8. In some embodiments, the interposer device 700 comprises sub-interposer devices 700A and 700B, wherein the sub-interposer devices 700A and 700B may be used to replace the interposer device 100 in FIG. 1 and coupled to the semiconductor devices DEV1 and DEV2 for transmitting circuit signals between the semiconductor devices DEV1 and DEV2.

In some embodiments, the sub-interposer device 700A is similar to the interposer device 100 of FIG. 1, and the sub-interposer device 700B is a mirror image of the sub-interposer device 700A. The sub-interposer device 700A comprises bump regions 710A, 720A and a channel region 730A. The sub-interposer device 700B comprises bump regions 710B, 720B and a channel region 730B. The difference between the sub-interposer devices 700A and 700B is that the extension direction of turning portions, branch portions and wires S of the sub-interposer device 700A is opposite to the extension direction of turning portions, branch portions and wires S of the sub-interposer device 700B.

As shown in FIG. 7, in the metal layer M2, the bump region 710A of the sub-interposer device 700A comprises turning portions S1_TA-S3_TA, G1_TA-G4_TA and branch portions G2_BA, G3_BA extending parallel to the direction D2. On the other hand, in the metal layer M2, the bump region 710B of the sub-interposer device 700B comprises turning portions S1_TB-S3_TB, G1_TB-G4_TB and branch portions G2_BB, G3_BB extending parallel to the direction D2, but the extension direction of the turning portions S1_TB-S3_TB, G1_TB-G4_TB and the branch portions G2_BB, G3_BB is opposite to the extension direction of the turning portions S1_TA-S3_TA, G1_TA-G4_TA and the branch portions G2_BA, G3_BA.

The relationship of the extension directions of the turning portions and the branch portions between the bump regions 720A and 720B is similar to the relationship of the extension directions of the turning portions and the branch portions between the bump regions 710A and 710B. For the sake of brevity, detailed descriptions are omitted.

It can be seen from FIG. 7 and FIG. 8 that since the interposer device may have multiple sub-interposer devices, the semiconductor devices DEV1 and DEV2 may transmit circuit signals through different circuit arrangements, thereby increasing the flexibility of wiring.

It should be noted that for ease of illustration, the signal lines S1-S12 and the ground lines G in FIGS. 2-8 are illustrated in the same width, but the present disclosure is not limited thereto. In some embodiments, the width of the ground lines G is greater than the width of the signal lines S1-S12.

With the semiconductor package structure 10 and the interposer device 100 of the present disclosure, the configuration of the vias can be arranged under the situation that the signal lines and the ground lines are kept in a regular arrangement, so as to improve the effect of shielding of the ground lines in the 2.5D high signal density semiconductor package structure, thereby improving the stability and quality of the signal lines when transmitting and receiving circuit signals.

The above are preferred embodiments of the present disclosure, and various modifications and equivalent changes may be made to the structure of the present disclosure without departing from the scope or spirit of the present disclosure. In view of the foregoing, it is intended that the present disclosure cover modifications and variations of this invention provided they fall within the scope of the following claims.

What is claimed is:

1. An interposer device, configured to transmit a plurality of circuit signals between two semiconductor devices, comprising:
    two first bump regions, respectively coupled to the two semiconductor devices;
    a first channel region, connected between the two first bump regions;
    a plurality of first signal lines, embedded in the two first bump regions and the first channel region, and electrically connected to the two semiconductor devices for transmitting the plurality of circuit signals; and a plurality of first ground lines, embedded in the two first bump regions and the first channel region for shielding the plurality of first signal lines, wherein in each of the two first bump regions, each of the plurality of first signal lines comprises a signal turning point, a trunk portion and a turning portion, wherein the signal turning point of each of the plurality of first signal lines is connected between the trunk portion and the turning portion of a corresponding one of the plurality of first signal lines, the trunk portion of each of the plurality of first signal lines extends parallel to a first direction, and the turning portion of each of the plurality of first signal lines extends parallel to a second direction, so that when the interposer device is viewed parallel to a third direction, each of the plurality of first signal lines in each of the two first bump regions is L-shaped, wherein the third direction is substantially perpendicular to the first direction and the second direction, wherein each of the two first bump regions comprises a plurality of vias coupled to the plurality of first signal lines and arranged parallel to the first direction, and wherein each of the plurality of vias is connected to an end of the turning portion of each of the plurality of first signal lines.

2. The interposer device of claim 1, wherein the plurality of first ground lines are arranged alternately with the plurality of first signal lines.

3. The interposer device of claim 2, wherein when one of the plurality of first ground lines is arranged adjacent to one of the plurality of first signal lines, the one of the plurality of first ground lines comprises two ground turning points respectively located in the two first bump regions, wherein a part of the one of the plurality of first ground lines, located between the two ground turning points, extends parallel to the first direction, and the other part of the one of the plurality of first ground lines extends parallel to the second direction, so that when the interposer device is viewed parallel to the third direction, the one of the plurality of first ground lines is L-shaped in each of the two first bump regions.

4. The interposer device of claim 2, wherein when one of the plurality of first ground lines is arranged adjacent to two of the plurality of first signal lines, the one of the plurality of first ground lines comprises four ground turning points, two of the four ground turning points are located in one of the two first bump regions, and the other two of the four ground turning points are located in another one of the two first bump regions, wherein a part of the one of the plurality of first ground lines, located between the four ground turning points, extends parallel to the first direction, and the other part of the one of the plurality of first ground lines extends parallel to the second direction, so that when the interposer device is viewed parallel to the third direction, the one of the plurality of first ground lines is F-shaped in each of the two first bump regions.

5. The interposer device of claim 1, wherein each of the two first bump regions comprises a plurality of metal layers and a bump layer, and the bump layer comprises a plurality of micro bumps and is located above the plurality of metal layers in the third direction, wherein the plurality of micro bumps are coupled to the two semiconductor devices, and are respectively coupled to the plurality of first signal lines through the plurality of vias, wherein the plurality of vias are embedded between the plurality of metal layers.

6. The interposer device of claim 5, wherein one of the plurality of metal layers, located at the bottom of the plurality of metal layers in the third direction, comprises a deep trench capacitor.

7. The interposer device of claim 5, wherein the plurality of vias do not overlap each other, the plurality of first signal lines of one of the plurality of metal layers and the plurality of first signal lines of an adjacent one of the plurality of metal layers do not overlap with each other, and the plurality of first signal lines of the one of the plurality of metal layers overlap the plurality of first ground lines of the adjacent one of the plurality of metal layers.

8. The interposer device of claim 1, further comprising a ground mesh, the plurality of first ground lines are coupled to the ground mesh, and the ground mesh is configured to provide a ground voltage to the plurality of first ground lines.

9. The interposer device of claim 8, wherein the plurality of first ground lines are respectively coupled to a plurality of ground mesh contacts on the ground mesh, and the distances between two of the plurality of ground mesh contacts adjacent to each one of the plurality of first signal lines are the same.

10. The interposer device of claim 1, further comprising:

two second bump regions, respectively coupled to the two semiconductor devices;

a second channel region, connected between the two second bump regions;

a plurality of second signal lines, embedded in the two second bump regions and the second channel region, and electrically connected to the two semiconductor devices for transmitting the plurality of circuit signals; and a plurality of second ground lines, embedded in the two second bump regions and the second channel region for shielding the plurality of second signal lines, wherein in each of the two second bump regions, each of the plurality of second signal lines comprises a signal turning point, a trunk portion and a turning portion, wherein the signal turning point of each of the plurality of second signal lines is connected between the trunk portion and the turning portion of a corresponding one of the plurality of second signal lines, the trunk portion of each of the plurality of second signal lines extends parallel to the first direction, and the turning portion of each of the plurality of second signal lines extends parallel to the second direction and extends away from the turning portion of the plurality of first signal lines.

11. A semiconductor package structure, comprising:

two semiconductor devices; and an interposer device, coupled between the two semiconductor devices and configured to transmit a plurality of circuit signals between the two semiconductor devices, comprising:

two first bump regions, respectively coupled to the two semiconductor devices;

a first channel region, connected between the two first bump regions;

a plurality of first signal lines, embedded in the two first bump regions and the first channel region, and electrically connected to the two semiconductor devices for transmitting the plurality of circuit signals; and a plurality of first ground lines, embedded in the two first bump regions and the first channel region for shielding the plurality of first signal lines, wherein in each of the two first bump regions, each of the plurality of first signal lines comprises a signal turning point, a trunk portion and a turning portion, wherein the signal turning point of each of the plurality of first signal lines is connected between the trunk portion and the turning portion of a corresponding one of the plurality of first signal lines, the trunk portion of each of the plurality of first signal lines extends parallel to a first direction, and the turning portion of each of the plurality of first signal lines extends parallel to a second direction, so that when the interposer device is viewed parallel to a third direction, each of the plurality of first signal lines in each of the two first bump regions is L-shaped, wherein the third direction is substantially perpendicular to the first direction and the second direction, wherein each of the two first bump regions comprises a plurality of vias coupled to the plurality of first signal lines and arranged parallel to the first direction, and wherein each of the plurality of vias is connected to an end of the turning portion of each of the plurality of first signal lines.

12. The semiconductor package structure of claim 11, wherein the plurality of first ground lines are arranged alternately with the plurality of first signal lines.

13. The semiconductor package structure of claim 12, wherein when one of the plurality of first ground lines is arranged adjacent to one of the plurality of first signal lines, the one of the plurality of first ground lines comprises two ground turning points respectively located in the two first bump regions, wherein a part of the one of the plurality of first ground lines, located between the two ground turning points, extends parallel to the first direction, and the other part of the one of the plurality of first ground lines extends parallel to the second direction, so that when the interposer device is viewed parallel to the third direction, the one of the plurality of first ground lines is L-shaped in each of the two first bump regions.

14. The semiconductor package structure of claim 12, wherein when one of the plurality of first ground lines is arranged adjacent to two of the plurality of first signal lines, the one of the plurality of first ground lines comprises four ground turning points, two of the four ground turning points are located in one of the two first bump regions, and the other two of the four ground turning points are located in another one of the two first bump regions, wherein a part of the one of the plurality of first ground lines, located between the four ground turning points, extends parallel to the first direction, and the other part of the one of the plurality of first ground lines extends parallel to the second direction, so that when the interposer device is viewed parallel to the third direction, the one of the plurality of first ground lines is F-shaped in each of the two first bump regions.

15. The semiconductor package structure of claim 11, wherein each of the two first bump regions comprises a plurality of metal layers and a bump layer, and the bump layer comprises a plurality of micro bumps and is located above the plurality of metal layers in the third direction, wherein the plurality of micro bumps are coupled to the two semiconductor devices, and are respectively coupled to the plurality of first signal lines through the plurality of vias, wherein the plurality of vias are embedded between the plurality of metal layers.

16. The semiconductor package structure of claim 15, wherein one of the plurality of metal layers, located at the bottom of the plurality of metal layers in the third direction, comprises a deep trench capacitor.

17. The semiconductor package structure of claim 15, wherein the plurality of vias do not overlap each other, the plurality of first signal lines of one of the plurality of metal layers and the plurality of first signal lines of an adjacent one of the plurality of metal layers do not overlap with each other, and the plurality of first signal lines of the one of the plurality of metal layers overlap the plurality of first ground lines of the adjacent one of the plurality of metal layers.

18. The semiconductor package structure of claim 11, wherein the interposer device further comprises a ground mesh, the plurality of first ground lines are coupled to the ground mesh, and the ground mesh is configured to provide a ground voltage to the plurality of first ground lines.

19. The semiconductor package structure of claim 18, wherein the plurality of first ground lines are respectively coupled to a plurality of ground mesh contacts on the ground mesh, and the distances between two of the plurality of ground mesh contacts adjacent to each one of the plurality of first signal lines are the same.

20. The semiconductor package structure of claim 11, wherein the interposer device further comprises:

two second bump regions, respectively coupled to the two semiconductor devices;

a second channel region, connected between the two second bump regions;

a plurality of second signal lines, embedded in the two second bump regions and the second channel region, and electrically connected to the two semiconductor devices for transmitting the plurality of circuit signals; and a plurality of second ground lines, embedded in the two second bump regions and the second channel region for shielding the plurality of second signal lines, wherein in each of the two second bump regions, each of the plurality of second signal lines comprises a signal turning point, a trunk portion and a turning portion, wherein the signal turning point of each of the plurality of second signal lines is connected between the trunk portion and the turning portion of a corresponding one of the plurality of second signal lines, the trunk portion of each of the plurality of second signal lines extends parallel to the first direction, and the turning portion of each of the plurality of second signal lines extends parallel to the second direction and extends away from the turning portion of the plurality of first signal lines.

* * * * *